(12) United States Patent
Miyachi et al.

(10) Patent No.: US 6,647,042 B2
(45) Date of Patent: Nov. 11, 2003

(54) NITRIDE SEMICONDUCTOR LASER DEVICE AND METHOD FOR MANUFACTURING THE SAME

(75) Inventors: Mamoru Miyachi, Tsurugashima (JP); Hiroyuki Ota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/109,721

(22) Filed: Apr. 1, 2002

(65) Prior Publication Data

US 2002/0142503 A1 Oct. 3, 2002

(30) Foreign Application Priority Data

Apr. 2, 2001 (JP) .......................... 2001-103068

(51) Int. Cl.[7] .............................. H01S 5/00; H01S 3/04
(52) U.S. Cl. ............................................ 372/45; 372/36
(58) Field of Search .............................. 372/36, 34, 50, 372/46, 45; 438/22

(56) References Cited

U.S. PATENT DOCUMENTS

| 4,592,059 A | * | 5/1986 | Westermeier ................. 372/36 |
| 5,181,216 A | * | 1/1993 | Ackerman et al. ............ 372/36 |
| 5,294,815 A | | 3/1994 | Iechi |
| 5,621,746 A | | 4/1997 | Futatsugi et al. |
| 5,953,581 A | * | 9/1999 | Yamasaki et al. ............. 438/22 |

FOREIGN PATENT DOCUMENTS

| DE | 100 22 879 A1 | 12/2000 |
| EP | 0 593 031 A2 | 4/1994 |
| EP | 1 014 520 A1 | 6/2000 |
| JP | 63-208293 | 8/1988 |
| JP | 2-35788 | 2/1990 |

* cited by examiner

*Primary Examiner*—Quyen Leung
(74) *Attorney, Agent, or Firm*—Sughrue Mion, PLLC

(57) ABSTRACT

A group-III nitride semiconductor laser device with excellent optical characteristics and its manufacturing method are provided. The method does not include steps that require high assembly precision. The group-III nitride semiconductor laser device comprises a substrate which has a cut-out portion. A laser facet of a multi-layer body is located near the cut-out portion of the substrate.

8 Claims, 10 Drawing Sheets

NITRIDE SEMICONDUCTOR LASER DEVICE AND METHOD FOR MANUFACTURING THE SAME

BACKGROUND OF THE INVENTION

1. Field of the Invention

The present invention relates generally to a laser device and particularly to a group-III nitride semiconductor laser device.

2. Description of the Related Art

In order to achieve an operation as a laser, an optical laser cavity comprising a pair of reflecting mirrors is required. In semiconductor laser devices (Fabry-Perot type) using such semiconductor crystal materials as GaAs, a multi-layer body including a laser structure is cleaved simultaneously with a GaAs crystal substrate and then this cleaved facet is used as a cavity mirror of the laser device.

As concerns a semiconductor laser device formed from group-III nitrides, sapphire is commonly used as the substrate. Since sapphire does not have a clear cleavage plane, the cavity mirror can hardly be formed by cleaving. Accordingly, the cavity mirror of the semiconductor laser devices is formed by dry etching such as reactive ion etching (RIE).

Sapphire is chemically very stable and is therefore etched little, so that a sapphire substrate 101 is left unetched after the dry etching process. As a result a terraced structure (a terrace portion 103) is formed as extending beyond a cavity mirror 102' of a multi-layer body 102 formed from group-III nitrides, as shown in FIG. 1. In such a case, a part of a laser light 104 is reflected by the terrace portion 103, thereby a far-field pattern is formed as a plurality of spots in stead of a single spot. Thus, the semiconductor laser device 100 could not be used particularly as a light source for a optical storage device.

To overcome this problem, a method for transferring the multi-layer body onto a substrate which is highly cleavable and cleaving this sample to form the cavity mirror has been proposed. Specifically, the multi-layer body is formed on the sapphire substrate, and this sample is bonded onto a carrier substrate which is highly cleavable. After removing the sapphire substrate from the multi-layer body, the multi-layer body is cleaved along with the carrier substrate, thereby obtaining a laser device with a cleaved facet serving as the cavity mirror.

OBJECTS AND SUMMARY OF THE INVENTION

In the manufacturing process for the conventional semiconductor laser device 100 mentioned above, if there is even a slight misalignment between the carrier substrate 105 and the multi-layer body 102 which are glued together, as shown in FIG. 2, a cleaved facet 105' of the carrier substrate 105 is partially extended, in the shape of a "terrace", beyond a cavity mirror 102' of the multi-layer body 102. In such a case, even if a dielectric mirror stack is formed on the cavity mirror 102' by a sputtering technique, sufficiently high reflectivity cannot be obtained because the coating film thickness varies due to the terrace portion 103'. As a result, sufficient optical characteristics as a laser device cannot be achieved. Furthermore, as mentioned earlier, part of the beam is reflected by the terrace portion 103', resulting in multiplication of the far-field pattern, causing practical problems.

It is therefore an object of the present invention to provide a group-III nitride semiconductor laser device with excellent optical characteristics, and a method for manufacturing the same without steps requiring high assembly precision.

DETAILED DESCRIPTION OF THE PREFERRED EMBODIMENTS

Figure 1:
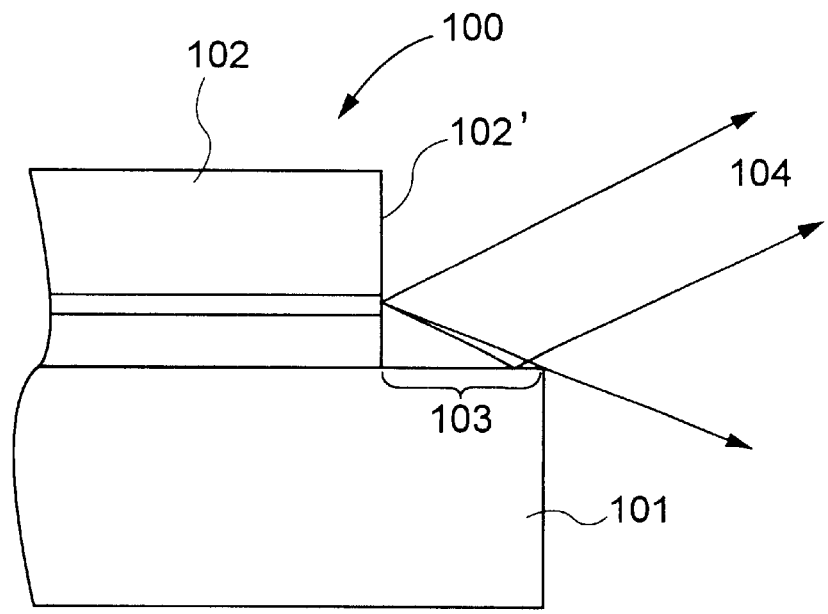
FIG. 1 is an enlarged cross section of a portion of a conventional nitride based semiconductor device formed on a sapphire substrate near a laser facet.
Figure 2:
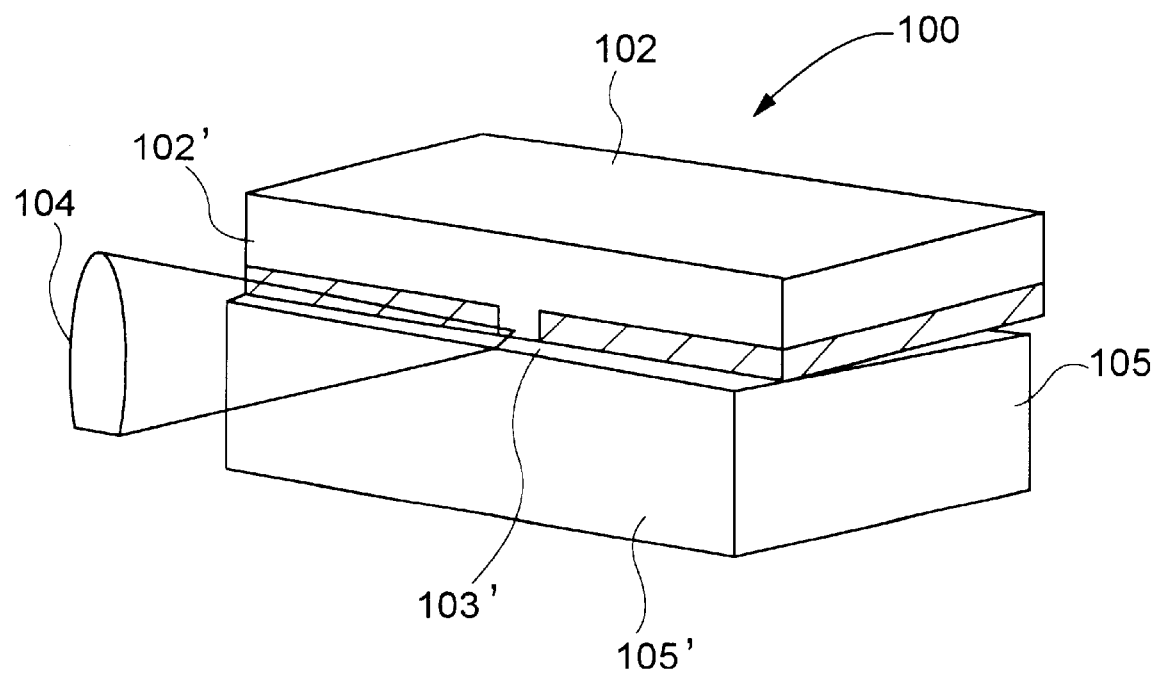
FIG. 2 is a perspective view of a nitride based semiconductor device formed by a conventional wafer transferring method.

A nitride based semiconductor laser device according to the present invention comprises a multi-layer body which is a plurality of crystal layers made of a group-III nitrides $(Al_xGa_{1-x})_{1-y}In_yN$ ($0 \leq x \leq 1, 0 \leq y \leq 1$), and a substrate which is highly cleavable, the multi-layer body and the substrate being glued upon each other, characterized in that the substrate has at least a cut-out portion near the laser facet of the multi-layer body.

A method for manufacturing a nitride based semiconductor laser device comprising a multi-layer body which is a plurality of sequentially stacked crystal layers made of a group-III nitride semiconductor $(Al_xGa_{1-x})_{1-y}In_yN$ ($0 \leq x \leq 1, 0 \leq y \leq 1$) according to the present invention comprises a wafer forming step for forming a laser wafer by stacking the multi-layer body on a first substrate, a cut-out portion forming step for forming a cut-out portion on a second substrate, a gluing step for aligning and gluing a surface of the second substrate on which the cut-out portion has been formed on the multi-layer body, a step for removing the first substrate from the multi-layer body, and a cleaving step for forming a cavity mirror by cleaving a glued body comprising the second substrate and the multi-layer body.

Further, a method for manufacturing an another nitride based semiconductor laser device comprising a multi-layer body which is a plurality of sequentially stacked crystal layers made of a group-III nitride semiconductor $(Al_xGa_{1-x})_{1-y}In_yN$ ($0 \leq x \leq 1, 0 \leq y \leq 1$) according to the present invention comprises a wafer forming step for forming a laser wafer by forming the multi-layer body on a first substrate, a gluing step for gluing a second substrate on the multi-layer body, a step for removing the first substrate from the multi-layer body, a cleaving step for forming a cavity mirror by cleaving a glued body comprising the second substrate and the multi-layer body, and an etching step for etching out the terrace portion of the second substrate.

In the following, embodiments of the nitride semiconductor laser device, especially formed from group-III nitride, according to the present invention will be described by referring to the drawings.

(Embodiment 1)

Figure 3:
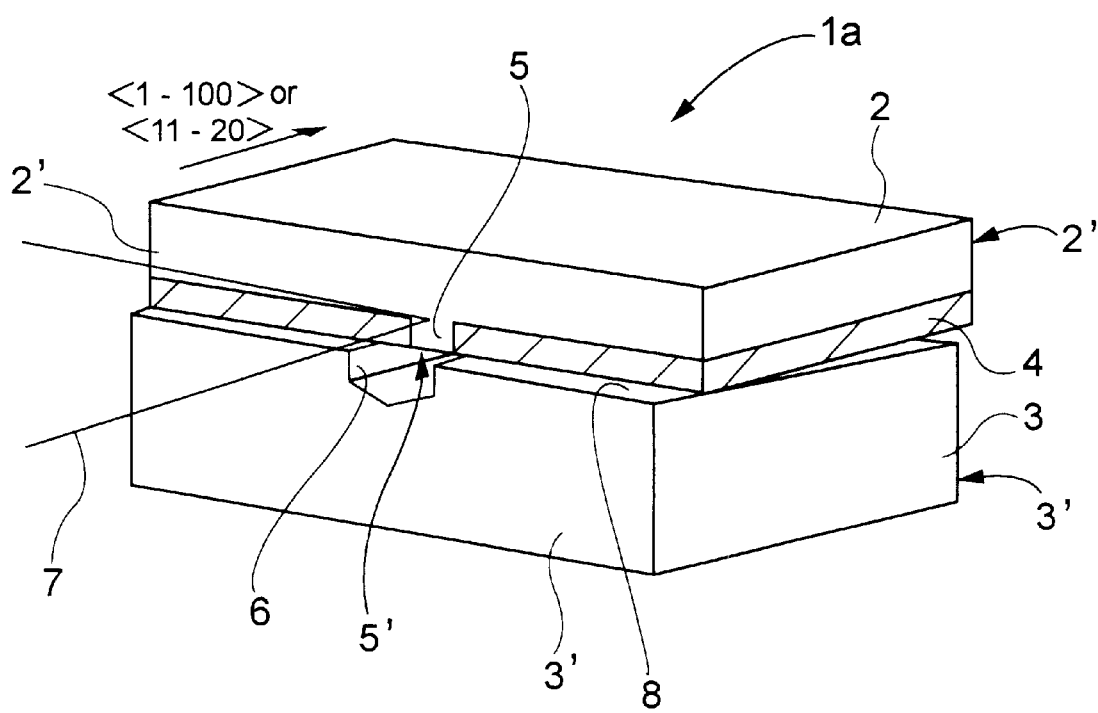
FIG. 3 is a perspective view of a nitride based semiconductor device according to the present invention.

As shown in FIG. 3, a group-III nitride semiconductor laser device 1a according to the present invention has such a structure that a multi-layer body 2 formed from group-III nitrides is glued on a carrier substrate 3 by means of a glue layer 4. The multi-layer body 2 has a waveguide 5, with a pair of parallel cavity mirrors 2'. The waveguide 5 in the multi-layer body 2 is disposed facing an opening portion of a cut-out portion 6 formed in the carrier substrate 3, the cut-out portion having a concave cross section. The cut-out portion 6 may not run the length between opposing planes 3' and 3' of the carrier substrate 3 along the waveguide 5; It may instead be formed by cutting the carrier substrate 3 toward the inside of the device just near a laser facet. Namely, since a laser light 7 is emitted from the cavity mirror 2' of the laser device 1a, the reflection of the laser light 7 can be prevented as long as a terrace portion 8 near the laser facet is removed.

Geometry of the waveguide 5 may be of either ridge stripe structure, inner stripe structure, or contact stripe structure, for example, as long as the laser facet is located near the opening portion of the cut-out portion 6.

In the following, a method for manufacturing the above-described semiconductor laser device will be described.

Figure 4:
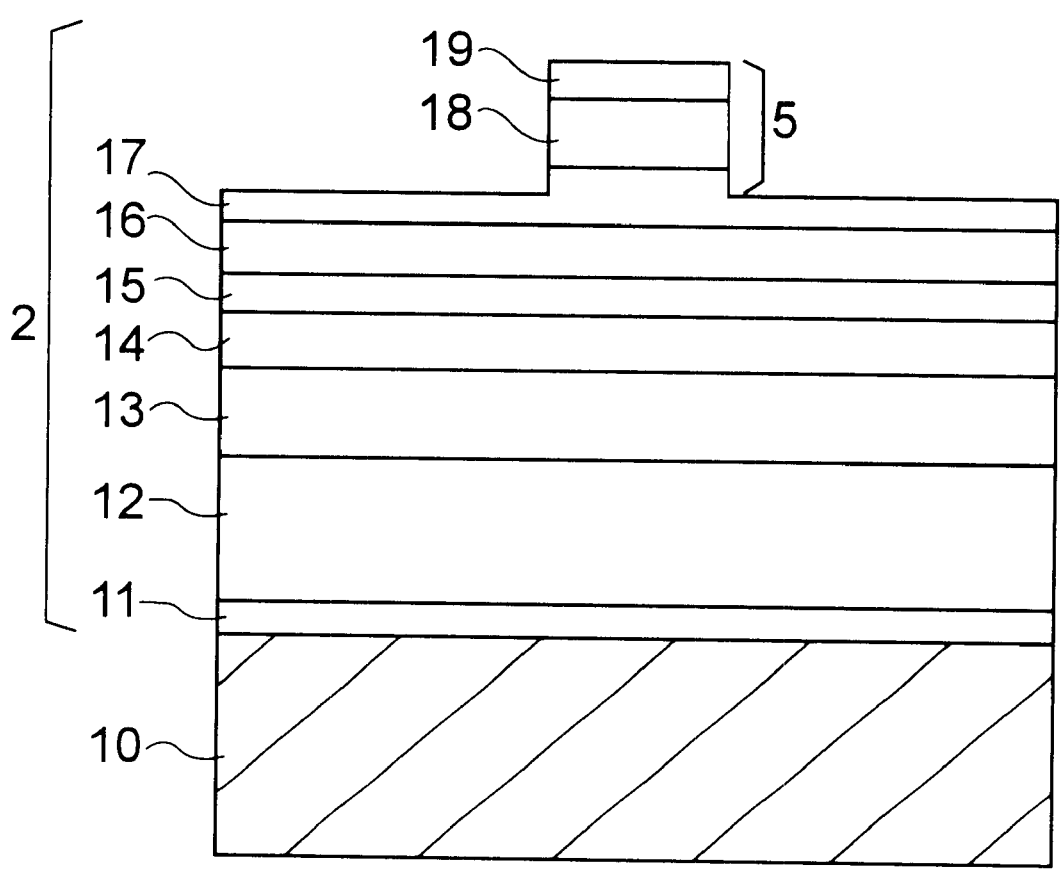
FIG. 4 is a cross section of a laser wafer according to the present invention.

As shown in FIG. 4, a laser wafer is obtained by forming the nitride multi-layer body 2 which is a plurality of nitride crystal layers such as GaN on a sapphire c-plane substrate 10 by the MOCVD method or the like. Specifically, the multi-layer body 2 comprises sequentially stacked layers including a lower-temperature buffer layer 11 made from GaN, an n-GaN underlying layer 12 to which Si has been doped to provide it with n-type conductivity, an n-AlGaN cladding layer 13, an n-GaN guide layer 14, a multiple quantum well (MQW) active layer 15 consisting of five layers of $In_{y1}Ga_{1-y1}N$ ($y_1$=0.08, thickness 30 Å)/$In_{y2}Ga_{1-y2}N$($y_2$=0.01, thickness 60 Å) stacked one upon another, a p-AlGaN electron barrier layer 16 to which magnesium has been doped to provide it with p-type conductivity, a p-GaN guide layer 17, a p-AlGaN cladding layer 18, and a p-GaN contact layer 19.

Next, a dry etching method is used to form a ridge 5 at the p-GaN guide layer 17, p-AlGaN cladding layer 18, and p-GaN contact layer 19 of the multi-layer body 2. The ridge 5 forms a waveguide by confining the current injected to the laser device and by forming an effective refractive index profile. Geometry of the waveguide may also be of the known other structure such as inner stripe structure, or contact stripe structure. Since the ridge 5 is cleaved in a subsequent step and the cleaved facet is used as the cavity mirror, the direction along which the ridge 5 extends corresponds to the direction normal to the cleavage planes of group-III nitrides forming the multi-layer body 2 (i.e., the direction normal to the sheet of FIG. 4; see FIG. 3 as well). Specifically, since cleaving is performed in a cleavage plane (1–100) of group-III nitrides and the cleaved facet is used as the cavity mirror, the ridge 5 is formed in a manner to extend along the normal to (1–100), i.e., <1–100>. The ridge 5 may also be formed along the normal to the other cleavage plane (11–20) of group-III nitrides crystal, i.e., along <11–20>.

Figure 5:
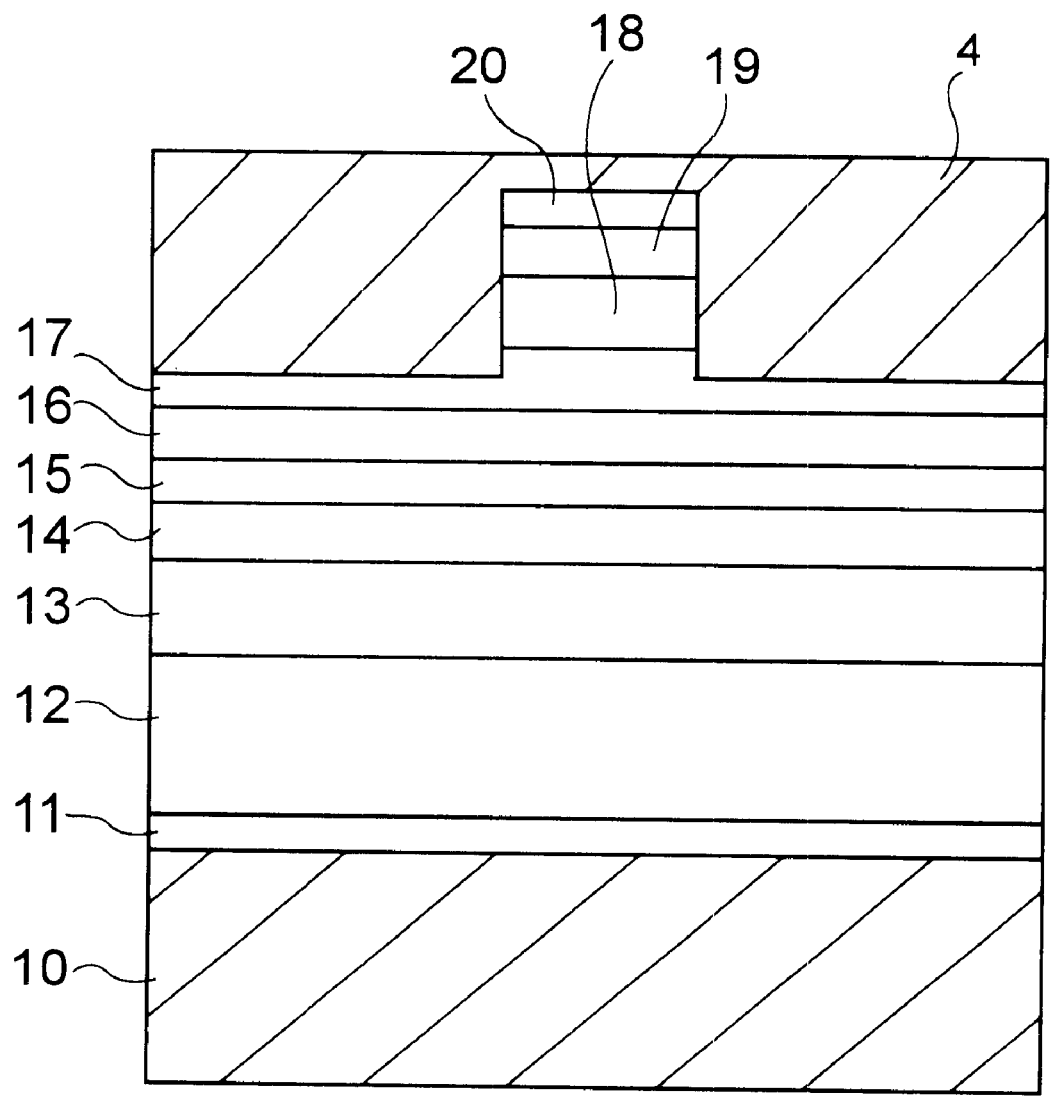
FIG. 5 is a cross sectional view of the laser wafer according to the present invention.

As shown in FIG. 5, Ni and Au are formed on a surface of the multi-layer body as an ohmic electrode 20, on which further a glue layer 4 made of Sn and Au is formed for gluing to the carrier substrate 3. Materials for the glue layer 4 include metals such as Ni, In, Pd, Sn, and Au, or an alloy of those metals, such as In—Pd and Au—Sn.

Figure 6:
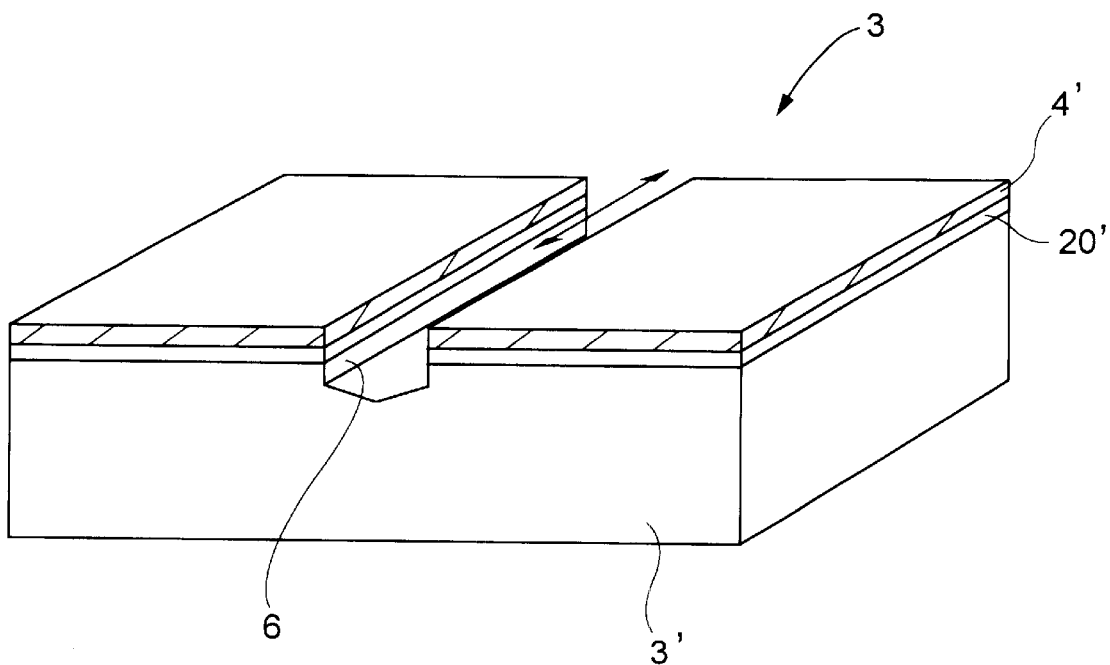
FIG. 6 is a perspective view of a carrier substrate according to the present invention.

As shown in FIG. 6, Cr and Au are formed also as an ohmic electrode 20' on a surface of the carrier substrate 3 made from p-GaAs, followed further by the formation of a glue layer 4' of Sn and Au thereon. The cut-out portion 6 with a concave cross section is formed in the carrier substrate 3 along the normal to the cleavage plane (1–100), i.e., along <1–100>, by dicing. The glue layer 4' may be made from the same material as that for the glue layer 4, such as mentioned above. The carrier substrate 3 may be made from a material which is highly cleavable, such as Si, InP, and AlN.

Figure 7:
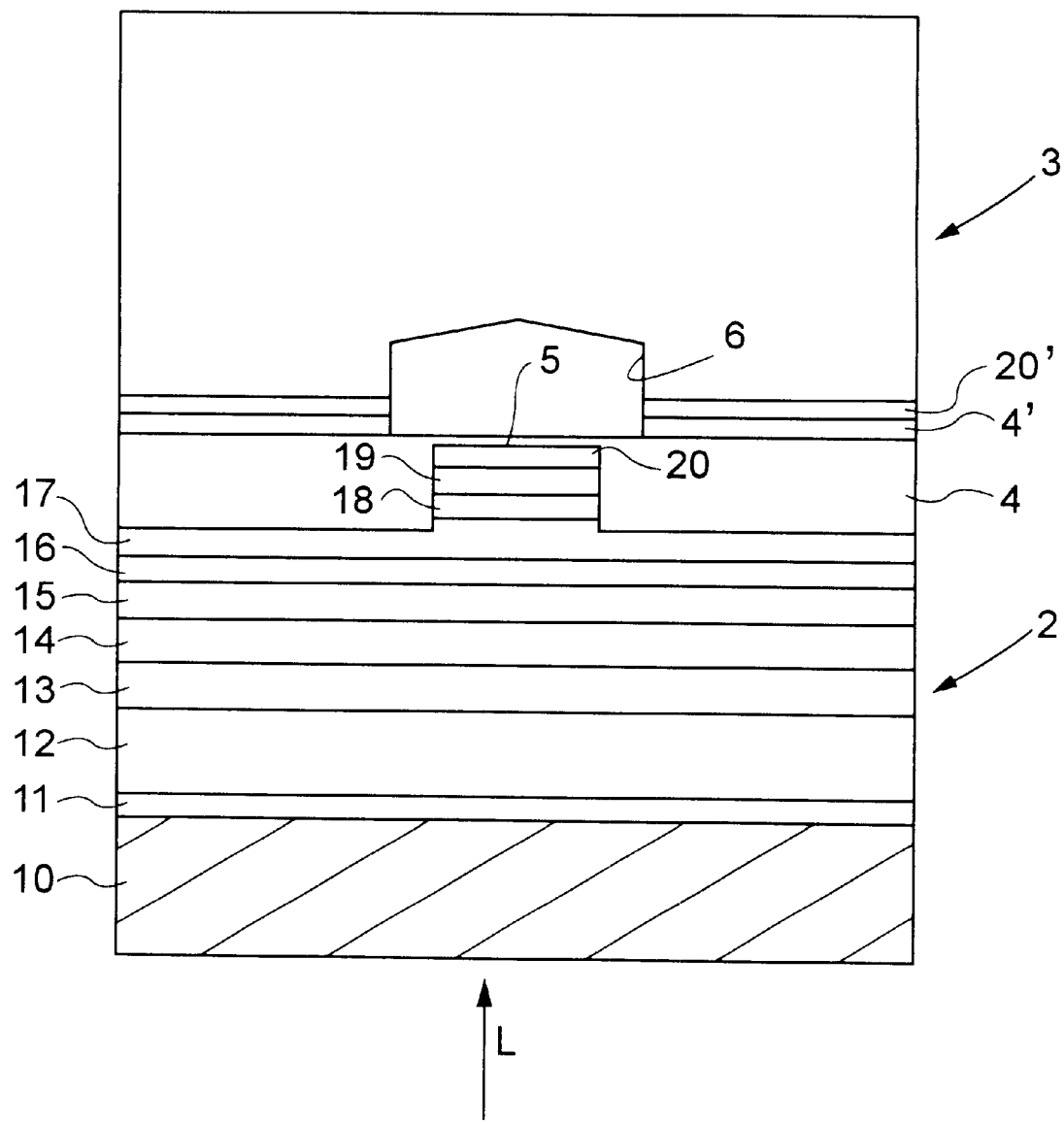
FIG. 7 is a cross sectional view of a glued body comprising the laser wafer and the carrier substrate glued upon each other according to the present invention.

Next, as shown in FIG. 7, the glue layer 4 of the multi-layer body 2 is glued on the glue layer 4' of the carrier substrate 3. This gluing step is performed such that the ridge 5 of the multi-layer body 2 is aligned with the cut-out portion 6 of the GaAs carrier substrate 3.

The multi-layer body 2 and the carrier substrate 3 are heated while under pressure to a temperature of about 300° C. at which the glue layers 4, 4' melt, thereby gluing and combining the multi-layer body 2 and the carrier substrate 3 together. The material of the glue layer 4 of the multi-layer body 2 may be different from that of the glue layer 4' of the carrier substrate 3. For example, two or more metals that can be fused together by heating, such as In and Pd, or Sn and Au, may be formed separately.

Next, the n-GaN under layer 12 is irradiated with a fourth harmonic of YAG laser (266 nm) focused by a condenser lens through the sapphire substrate. Sapphire, i.e., the substrate is almost transparent to the light with this wavelength. On the other hand, since the absorption edge of gallium nitride is 365 nm, the light is absorbed by the underlying layer 12 with a little penetration depth. Further, as there is a large lattice mismatch (about 15%) between the sapphire substrate 10 and the GaN crystal forming the underlying layer 12, the GaN crystal defect density is high in the underlying layer 12 near the sapphire substrate 10. As a result, there the absorbed light is mostly converted into heat. Accordingly, the temperature near the interface between the underlying layer 12 and the sapphire substrate 10 increases quickly by irradiation with a laser light, causing the GaN to be split into gallium and nitrogen. This irradiated light may be other than YAG laser as long as it is transparent to the substrate, i.e. sapphire, and absorbed by gallium nitride, as mentioned above. Such light includes KrF excimer laser (248 nm), for example.

After the irradiation of the laser light, the glued body is heated to a temperature above the melting point of gallium (30° C.) to remove the sapphire substrate 10 from the multi-layer body 2.

The glued body is then cleaved in a cleavage plane perpendicular to the direction along which the ridge 5 extends. This produces a laser device having the cleaved facet (1–100) or (11–20) of the multi-layer body 2 as the cavity mirror.

Even if the cleavage plane of the multi-layer body 2 and that of the carrier substrate 3 are somewhat misaligned from each other during the gluing step, there will be formed no terrace portion 8 mentioned above near the laser facet, where there is the cut-out portion of the carrier substrate 3 instead. Accordingly, a dielectric multi-layer stack with a sufficiently high reflectivity can be formed, and also the problem of the formation of multiple beams can be prevented. Other steps are not described here, for they are the same as those for the manufacture of conventional semiconductor laser devices.

(Embodiment 2)

Figure 8:
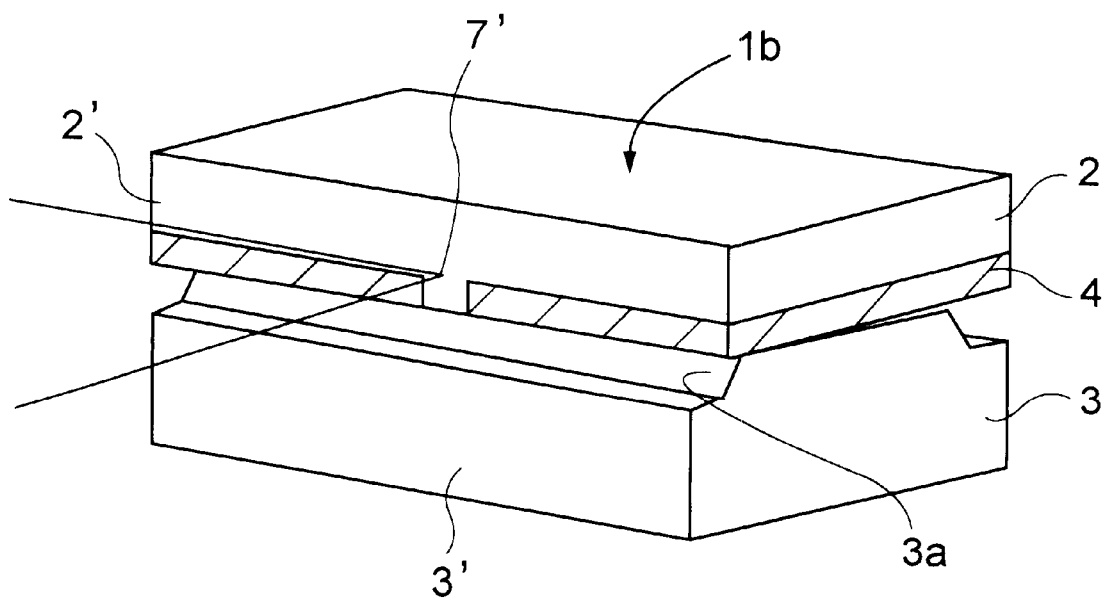
FIG. 8 is a perspective view of another nitride based semiconductor device according to the present invention.

As shown in FIG. 8, a group-III nitride semiconductor laser device 1b according to the present invention has such a structure where a multi-layer body 2 formed from group-III nitrides and a GaAs carrier substrate 3 are glued upon each other by a glue layer 4, as in the semiconductor laser device according to Embodiment 1. However, an edge portion 3a of the GaAs carrier substrate 3 is shaved off along a resonator plane 2' of the multi-layer body 2. In this case, too, the above-mentioned problem caused by the terrace portion can be prevented because of its absence in the GaAs carrier substrate 3 near a laser facet 7'.

In a method for manufacturing the present embodiment, the cut-out portion 6 is formed parallel to the cleavage plane 3' of the GaAs carrier substrate 3. A glued body is then formed by gluing the multi-layer body 2 and the GaAs carrier substrate 3 with setting their crystal orientations such that the two cleavage planes are substantially parallel to each other. Thereafter, the sapphire substrate is removed from the glued body. And the laser device 1b is obtained by cleaving along the cut-out portion 6. The other steps are the same as those for Embodiment 1 and therefore not described herein.

(Embodiment 3)

Figure 9:
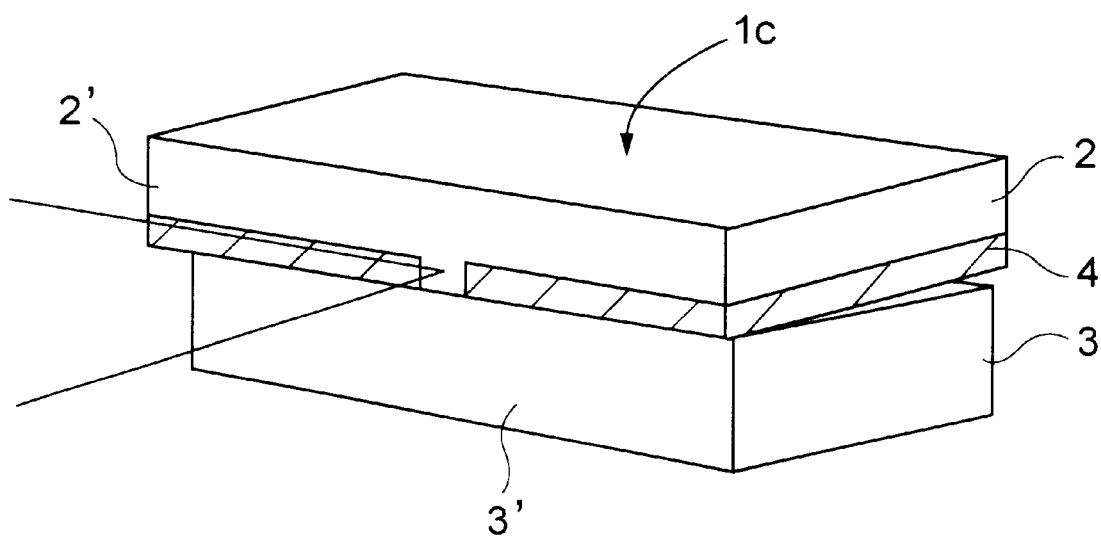
FIG. 9 is a perspective view of another nitride based semiconductor device according to the present invention.
Figure 10:
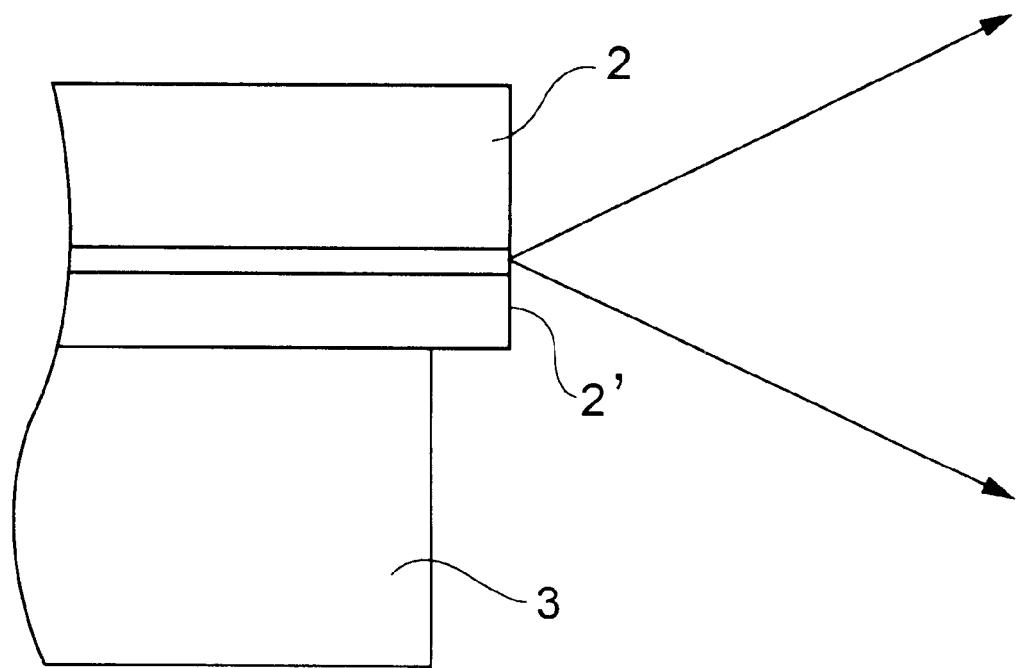
FIG. 10 is an enlarged cross sectional view of a portion of the nitride based semiconductor device of FIG. 9 near a laser facet.

As shown in FIGS. 9 and 10, another group-III nitride semiconductor laser device 1c according to the present invention has such a structure where a GaAs carrier substrate 3 is etched out toward the inside of the device beyond a cavity mirror 2' of a multi-layer body 2 formed from group-III nitrides.

In the method for manufacturing the present embodiment, the gluing step is performed without providing the concave cut-out portion 6 in the GaAs carrier substrate 3, in contrast to Embodiments 1 and 2. Except for the absence of the formation of the cut-out portion 6, the manufacturing process is the same as the one for Embodiments 1 and 2 up to the step of forming the cavity mirror by cleaving.

In this case up to the cleaving step, if the cleavage plane of the multi-layer body 2 is misaligned with the cleavage plane of the GaAs carrier substrate 3 even slightly, a terrace portion will be partially formed in the carrier substrate 3 near the laser facet. To remove this terrace portion, etching is performed by using an etchant which has a faster etching rate with respect to GaAs as the material of the carrier substrate 3 than to group-III nitrides constituting the multi-layer body 2. Specifically, a solution in which sulfuric acid, hydrogen peroxide, and water are mixed at the ratio of 4:1:1 is used. Preferably, however, the mixture ratio and the like are varied to control the etching rate. By this etching, the GaAs carrier substrate 3 is preferentially etched, so that it is removed further inside the device than the cavity mirror 2' of the multi-layer body 2 (see FIG. 10 in particular). In this case, too, the problem caused by the terrace portion can be overcome because of its absence in the carrier substrate 3.

(Embodiment 4)

Figure 11:
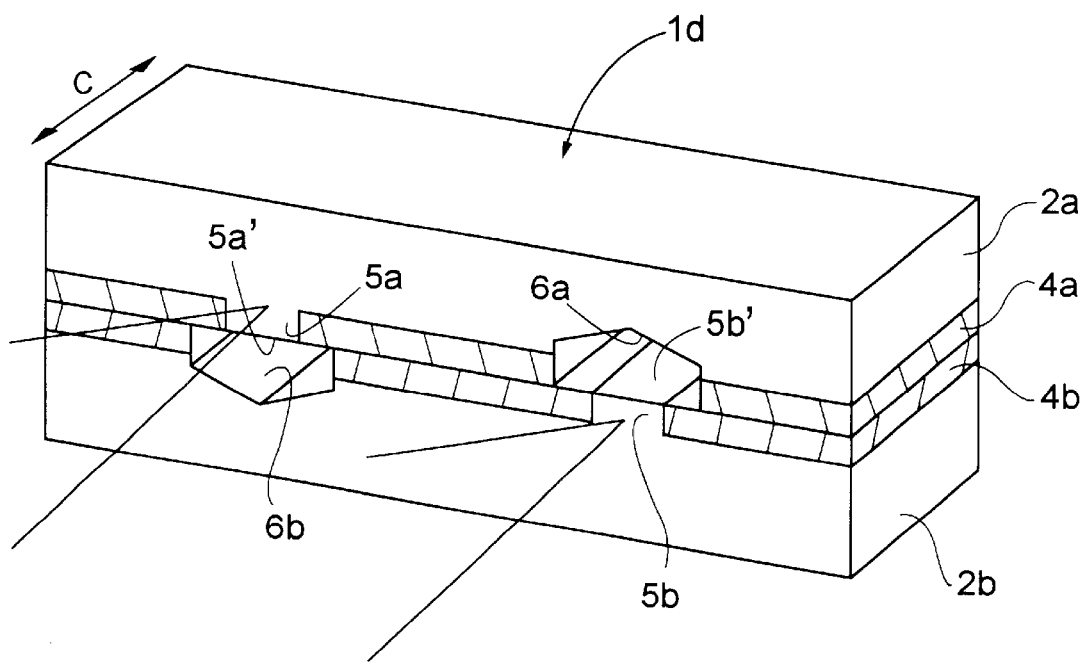
FIG. 11 is a perspective view of yet another nitride based semiconductor device according to the present invention.

As shown in FIG. 11, a yet another group-III nitride semiconductor laser device 1d according to the present invention is provided. Embodiment 1 is modified here in that the carrier substrate 3 of the semiconductor laser device 1a also has a laser structure. Namely, the semiconductor laser device 1d has a ridge 5b in a second multi-layer body 2b (corresponding to the carrier substrate 3 of Embodiment 1) at a different location from the ridge 5a of the multi-layer body 2a. The ridge 5b also extends along the normal to the cleavage plane of the second multi-layer body 2b.

Near the top of the ridge 5b, the multi-layer body 2a is shaved off in a concave cross section along the direction C in which the ridge 5b extends. As a result, the top of the ridge 5b does not contact the multi-layer body 2a.

When the two multi-layer bodies 2a and 2b emit laser light of different wavelengths, the semiconductor laser diode 1d functions as a two-wavelength laser diode. The second multi-layer body 2b may employ AlGaAs-based laser, GaAs-based laser, AlInP-based laser, and InP-based laser, for example.

Thus, according to the present invention, high-quality cavity mirror can be obtained with good reproducibility without employing steps that require high assembly precision. Accordingly, the production yields can be greatly improved. Also, a nitride-based semiconductor laser device with excellent optical characteristics which can be used as the light source for optical storage device, for example, can be obtained.

This application is based on a Japanese patent application No. 2001-103068 which is hereby incorporated by reference.

What is claimed is:

1. A nitride semiconductor laser device comprising a multi-layer body including a plurality of group-III nitride semiconductor $(Al_xGa_{1-x})_{1-y}In_yN$ ($0 \leq x \leq 1, 0 \leq y \leq 1$) crystal layers and a substrate which is highly cleavable, wherein said multi-layer body and said substrate are glued upon each other and said substrate has at least a cut-out portion near a laser facet of said multi-layer body.

2. The nitride semiconductor laser device according to claim 1, wherein a cleavage plane of said multi-layer body is substantially parallel to a cleavage plane of said substrate.

3. The nitride semiconductor laser device according to claim 2, wherein said cut-out portion is a concave groove provided along a waveguide of said laser device.

4. The nitride semiconductor laser device according to one of claims 1 to 3, wherein said substrate is made of an electrically conductive material.

5. The nitride semiconductor laser device according to one of claims 1 to 3, wherein said substrate comprises a second multi-layer body including a laser structure, said multi-layer body having a second cut-out portion located near a laser facet of said second multi-layer body.

6. The nitride semiconductor laser device according to claim 5, wherein said second cut-out portion is a concave groove provided along a waveguide of a laser device of said second multi-layer body.

7. The nitride semiconductor laser device according to claim 2, wherein said cut-out portion is formed substantially parallel to the cleavage plane of said substrate.

8. The nitride semiconductor laser device according to claim 7, wherein said substrate is made of an electrically conductive material.

* * * * *